United States Patent

Shelton et al.

[11] Patent Number: 5,593,040
[45] Date of Patent: Jan. 14, 1997

[54] ROTARY CLIP FOR SOLDER PALLET

[75] Inventors: Gary R. Shelton, Greentown; Kyle R. Street, Kokomo, both of Ind.

[73] Assignee: Delco Electronics Corporation, Kokomo, Ind.

[21] Appl. No.: 566,750

[22] Filed: Dec. 4, 1995

[51] Int. Cl.$^6$ .......................... B65D 73/02; H01B 17/56
[52] U.S. Cl. .................... 206/706; 206/560; 206/454; 24/115 L; 24/115 G; 269/297; 269/902; 248/488; 108/55.3
[58] Field of Search .................... 206/706, 707, 206/701, 724, 560, 451, 453, 454; 24/115 L, 115 G, 136 A; 108/51.1, 55.3; 248/201, 488; 269/301, 297, 902; 198/803.7, 803.9, 803.14, 346.2, 346.1

[56] References Cited

U.S. PATENT DOCUMENTS 3,573,366  4/1971  Joseph .
3,626,600  12/1971  Gaither ................................ 269/301
3,967,370  7/1976  Griffin et al. .
3,996,500  12/1976  Coules ................................ 248/201
4,395,586  7/1983  Eiermann et al. ................. 248/201
4,646,418  3/1987  Hattori ............................... 269/279
4,842,136  6/1989  Nakazato et al. ................. 206/454
4,946,121  8/1990  Troke ................................. 248/201

Primary Examiner—Paul T. Sewell
Assistant Examiner—Luan K. Bui
Attorney, Agent, or Firm—Mark A. Navarre

[57] ABSTRACT

A pallet holds one or more circuit boards for processing. A pallet opening for receiving the circuit board has grooves at one side to retain an edge of the circuit board and rotary clips at the other side to receive and hold the opposite edge of the board. Each clip is a disk which is mounted for rotation about a central axis and is constrained to two angular positions by a detent. A notch in the disk receives the circuit board when in one position and clamps the board against a seat when in the other position. The notch is deep enough to allow the board to be shifted laterally for alignment with test apparatus.

8 Claims, 2 Drawing Sheets

ROTARY CLIP FOR SOLDER PALLET

FIELD OF THE INVENTION

This invention relates to pallets for holding circuit boards during soldering and other processing and particularly to a mechanism for holding a circuit board in the pallet.

BACKGROUND OF THE INVENTION

In the manufacture of electronic circuits comprising electrical components on a circuit board, it is common practice to solder components to the board by first mounting the board or boards containing the components on a pallet, and then move the pallet along a conveyor through a wave solder station and then to an inspection station. The pallet has openings corresponding to the board size and shape. Typically the circuit boards are secured to the pallets by slipping one board edge into a groove alongside one side of the opening and hinging the board down so that the opposite side of the board seats at the opposite side of the opening. Spring clips at the opposite side engage the board edge to hold the board firmly to the pallet. In that position the board is held rigidly against lateral movement with respect to the pallet. The spring clips typically require substantial force for board insertion and removal. This can result in undesirable stresses on the circuit board.

After soldering, the pallets move to an inspection station where electrical testers automatically move probes onto the circuit boards to test circuit functions. It is often necessary to slightly shift the board laterally to make correct contact with the probes, but the clips do not allow such movement. As a result, the equipment which attempts such alignment tends to bind. It is therefore desirable to hold the circuit board in the pallet while affording lateral flexibility in positioning the board for circuit tests.

SUMMARY OF THE INVENTION

It is therefore an object of the invention to hold circuit boards in a pallet with sufficient lateral float for alignment with circuit test apparatus. Another object is to clip the boards in the pallet with the desired float and also allow easy installation and removal.

The spring clips of prior art pallets are replaced with rotary clips. One side of the circuit board is held, as before, in a groove on one side of the pallet opening, and is held on the other side by the rotary clips. Each rotary clip is a disk mounted in a housing for rotation about a central pivot pin. A peripheral notch in the disk receives the edge of the board, and a cam surface in the disk periphery cooperates with a spring detent to hold the disk in either of two positions: one for receiving the board edge during installation and the other for holding the board seated in the pallet. The force of installing or removing the board is the agent for rotating the clip from one position to the other. The notch is deep enough to permit a small lateral movement as needed for alignment with the test equipment probes.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
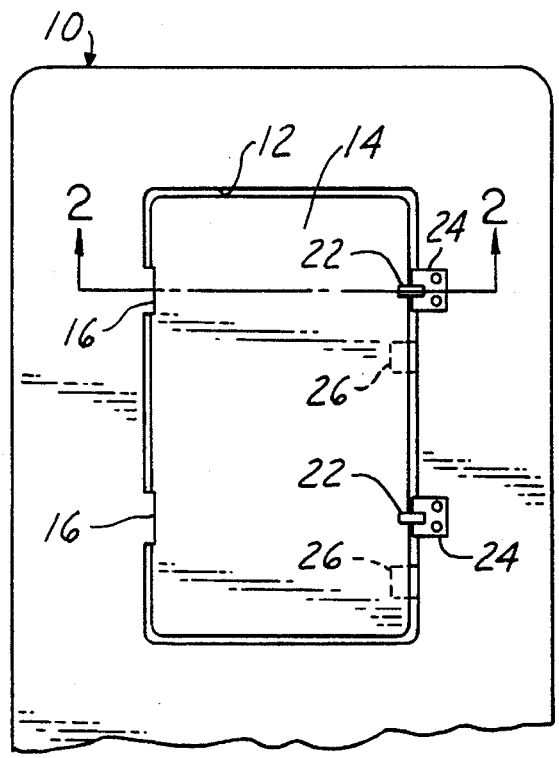
FIG. 1 is a plan view of a pallet holding a circuit board and equipped with rotary clips according to the invention.
Figure 2:
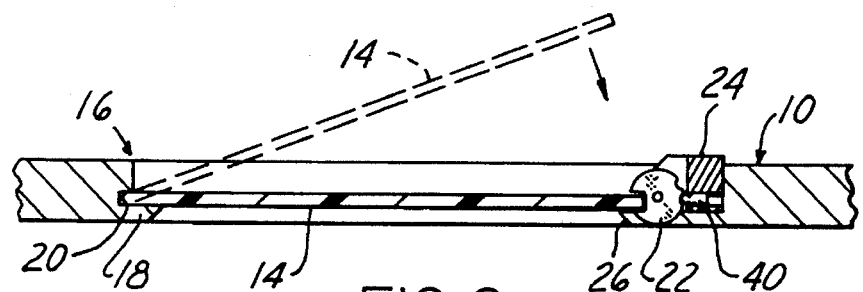
FIG. 2 is a cross section of the pallet taken along line 2—2 of FIG. 1.

Referring to FIGS. 1 and 2, a pallet 10 having an opening 12 contains a circuit board 14. One edge of the opening 12 comprises a support which has a pair of grips 16. Each grip comprises a seat 18 for supporting the lower surface of the board 14 and a groove 20 which captures the edge of the board. The other edge of the opening 12 comprises another support which carries a pair of rotary clips 22, each mounted in a housing 24. Seats 26 along the opening support the lower edge of the board. The seats 26 as well as the seats 18 are solder masking surfaces which are used to protect small areas of the board from solder. The clips 22 receive an edge of the board 14 and clamp it in position against the seats 26. As indicated in dashed lines in FIG. 2, the board is installed in the pallet opening by first slipping a rear edge of the board into the grooves 20 and then hinging the board down into engagement with the clips 22. The moving front edge of the board then is moving nearly perpendicular to the plane of the pallet when it engages the clips 22.

Figure 3:
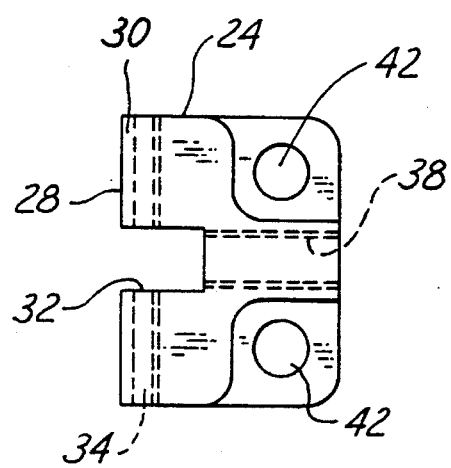
FIG. 3 is plan view of a clip housing of FIG. 1.
Figure 6:
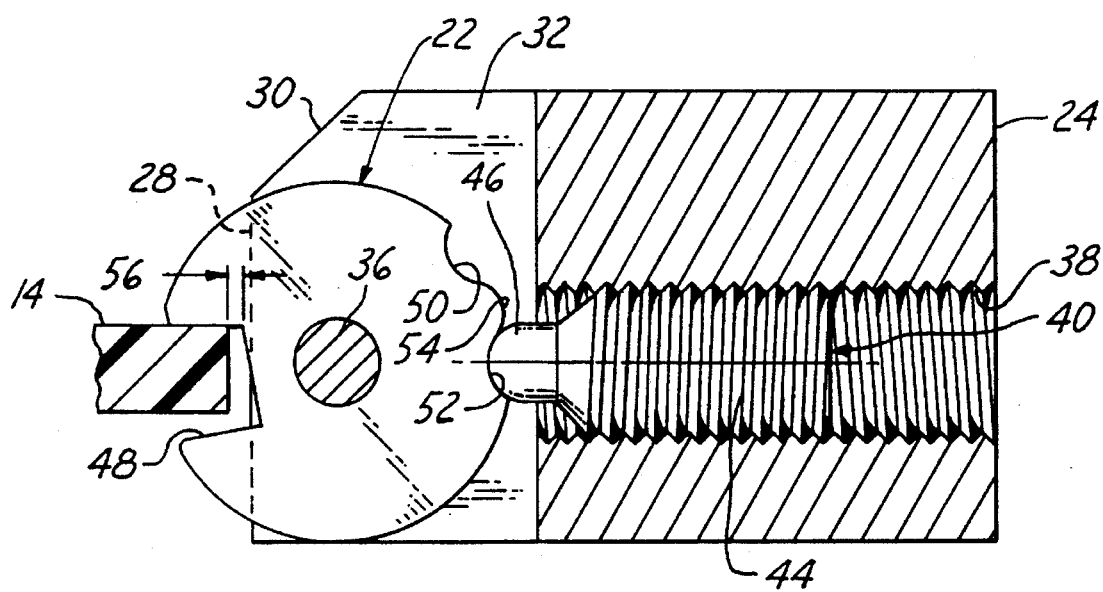
FIG. 6 is a sectioned view of the housing holding the clip of FIG. 1 in board clamping position according to the invention.

The clip housing 24, as best shown in FIGS. 3 and 6, has a front face 28 with a beveled upper surface 30, a slot 32 for receiving the clip 22, a bore 34 transverse of the slot for a pivot pin 36, a threaded bore 38 aligned with the slot for a spring detent mechanism 40, and a pair of holes 42 for fasteners to secure the housing to the pallet. The detent mechanism 40 is preferably a Vlier pin which is a small threaded stud 44 with a spring loaded ball or pin 46 protruding from the end to engage the edge of the clip 22.

Figure 4:
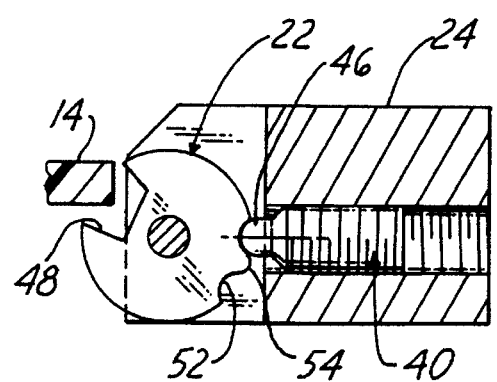
FIGS. 4 and 5 are schematic views of the clip and housing of FIG. 1 in a board-receiving position and an intermediate position, according to the invention.
Figure 5:
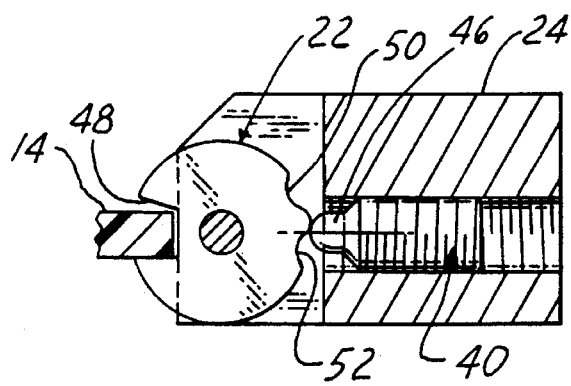

The outer edge of the clip 22 which protrudes from the housing 24 has a notch 48 to receive the edge of the circuit board 12. The inner edge of the clip has a cam surface comprising an upper depression or recess 50, a lower recess 52 and an intermediate hump 54 separating the recesses. The detent ball or pin 46 engages the cam surface to seat in recess 50 to hold the clip in position for the notch to receive the board as shown in FIG. 4 or in recess 52 to hold the clip in position to clamp the board in seated position as shown in FIG. 6. When the board is being installed or removed the spring detent allows the clip to rotate causing the pin 46 to slide over the hump 54 as shown in FIG. 5.

For installation of a board, the notch is poised at about 45∞. As the board is pressed into the pallet, it contacts the bottom surface of the slot causing the clip to rotate. Only when the board is fully seated against the seats 26, does the spring force cause the wheel to snap into the clamped position. There is a small amount of over-rotation which applies a downward force to keep the board clamped on the seat. When the board is fully installed, the slot contains the board in the vertical direction but will allow the board to float in the horizontal direction. The insertion and removal forces are very low and the board easily snaps in and out of the pallet.

For a board having a thickness of 0.060 inch, a disk diameter of about 0.25 inch is suitable. The disk is preferably made of titanium which resists solder adhesion. The notch is deep enough that there is a space 56 between the board edge and the bottom of the notch. This allows the board to float laterally, permitting the testing equipment to shift the board into alignment with test probes. Only a small amount of float is needed, say, 0.015 inch. The board is easily installed and removed with minimal stress on the board.

It will be apparent that a pallet equipped with the rotary clips has the advantage over those with standard spring clips since it can be loaded and unloaded without undue board stress and will allow shifting of the board by automatic test equipment for alignment with test probes.

The embodiments of the invention in which an exclusive property or privilege is claimed are defined as follows:

1. In a solder pallet for holding a circuit board for processing; a rotary clip for receiving and holding the board comprising:

a disk having a central axis;

means for mounting the disk for rotary motion about the axis;

a notch in the disk periphery for receiving an edge of a circuit board;

detent means for holding the disk in either of first and second positions, the first position aligning the notch for receiving the circuit board and the second position for holding the board, whereby insertion of the board into the notch while in first position effects rotation of the disk to second position.

2. The invention as defined in claim 1 wherein the detent means comprises:

cam means on the disk periphery including a pair of neighboring recesses separated by a hump, the recesses corresponding to the first and second positions; and a spring detent biased against the cam means for holding the disk with the detent seated in either recess and yielding to rotational force applied to the disk for allowing movement from one position to the other.

3. The invention as defined in claim 1 wherein the means for mounting the disk comprises:

a pivot pin supported on the pallet; and an axial aperture in the disk for receiving the pivot pin.

4. The invention as defined in claim 1 wherein the circuit board is inserted into the notch perpendicular to the axis and pushed into a seating position, and wherein:

force applied perpendicular to the axis by insertion of the board moves the disk against the bias of the detent means to the second position; and the detent means in second position clamps the board in seating position.

5. A solder pallet for holding a circuit board for processing comprising:

a pair of spaced parallel supports for holding opposed edges of the board;

one of the supports including a plurality of rotary clips for receiving and holding an edge of the board;

each clip comprising a disk having a peripheral notch for receiving an edge of the circuit board; and detent means for holding each disk with its notch positioned to receive a circuit board, for permitting disk movement to a board seating position and for holding the disk in seating position.

6. The invention as defined in claim 5 wherein each detent means comprises:

a cam formed in the periphery of the disk; and a spring detent mounted on the adjacent support and bearing on the cam.

7. The invention as defined in claim 5 wherein each detent means comprises:

cam means on the disk periphery including a pair of neighboring recesses separated by a hump, the recesses corresponding to the first and second positions; and a spring detent biased against the cam means for holding the disk with the detent seated in either recess and yielding to rotational force applied to the disk for allowing movement from one position to the other.

8. The invention as defined in claim 5 wherein:

the spacing between the supports is greater than the width of the circuit board; and the disk notches are deep enough to permit lateral movement of the circuit board between the supports.

* * * * *